(12) United States Patent
Stecher

(10) Patent No.: US 8,699,504 B2
(45) Date of Patent: Apr. 15, 2014

(54) PULSE DISTURBANCE WEIGHTING DETECTOR

(75) Inventor: Manfred Stecher, Muensing (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 1844 days.

(21) Appl. No.: 11/662,694

(22) PCT Filed: Sep. 30, 2005

(86) PCT No.: PCT/EP2005/010608
§ 371 (c)(1), (2), (4) Date: Aug. 7, 2007

(87) PCT Pub. No.: WO2006/037577
PCT Pub. Date: Apr. 13, 2006

(65) Prior Publication Data
US 2007/0297456 A1    Dec. 27, 2007

(30) Foreign Application Priority Data
Oct. 1, 2004  (DE) .......................... 10 2004 048 004

(51) Int. Cl.
*H04L 12/28*    (2006.01)
*G01R 29/00*    (2006.01)

(52) U.S. Cl.
USPC ........................................ 370/419; 324/114

(58) Field of Classification Search
USPC .................................. 370/419–422; 324/114
See application file for complete search history.

(56) References Cited

U.S. PATENT DOCUMENTS
4,736,163 A    4/1988  Berkhout et al.

FOREIGN PATENT DOCUMENTS
DE    10126830    6/2003
EP    0 379 050 A1    7/1990

OTHER PUBLICATIONS

"Weighting of Interference According to its Effect on Digital Communications Services," Manfred Stecher, Aug. 24, 1998, pp. 69-73.
"Critical Review of Converting Spectral Data into Prospective Bit Error Rates," Axel Knobloch and Heyno Garbe, Aug. 19, 2002, pp. 173-178.
"A Weighting Dector for the Effect of Interference on Digital Radiocommunication Services," Manfred Stecher, May 11, 2003, pp. 449-452.
International Search Report for PCT/EP2005/010608; mailed Jan. 13, 2006.

*Primary Examiner* — Dang Ton
*Assistant Examiner* — Kevin Lee
(74) *Attorney, Agent, or Firm* — Marshall, Gerstein & Borun LLP

(57) ABSTRACT

A rectifier circuit used for weighting pulse disturbances in relation to the influence thereof on digital radio systems, comprising a cascade circuit of an effective value rectifier and a linear average rectifier, wherein a peak value rectifier is arranged upstream from the effective value rectifier.

8 Claims, 1 Drawing Sheet

PULSE DISTURBANCE WEIGHTING DETECTOR

BACKGROUND OF THE INVENTION

1. Field of the Invention

The invention relates to a detector circuit for weighting impulsive disturbances in relation to their influence on digital radio systems.

2. Related Technology

A weighting detector of this type is known from DE 101 26 830 A1. It is also already known from DE 101 26 830 A1 to use a peak detector instead of the rms (root mean square) detector. Although these known weighting detectors take into account the profile of the weighting curve above and below the cut-off frequency, which for GSM for example is 1 kHz, it has been found that some measured pulse disturbance weighting profiles have a flat profile at high pulse repetition frequencies and only at relatively low pulse repetition frequencies pass into a profile which rises by approximately 10 dB/decade. Pulse disturbance weighting profiles of this type are therefore not optimally weighted by these known weighting detectors.

SUMMARY OF THE INVENTION

The invention therefore provides a weighting detector for impulsive disturbance of the type mentioned at the outset which correctly weights impulsive disturbances not only above and below the recognized cut-off frequency but also at high pulse repetition frequencies.

According to the invention, a detector circuit for weighting of impulsive disturbances in relation to their influence on digital radio system comprises a cascade circuit of an rms detector and a linear average detector, and a first peak detector arranged upstream of the rms detector.

The combination in accordance with the invention of the two known measures of the type mentioned at the outset allows correct weighting even at high pulse repetition frequencies, for example impulsive disturbances above 100 kHz.

BRIEF DESCRIPTION OF THE INVENTION

Figure 1:
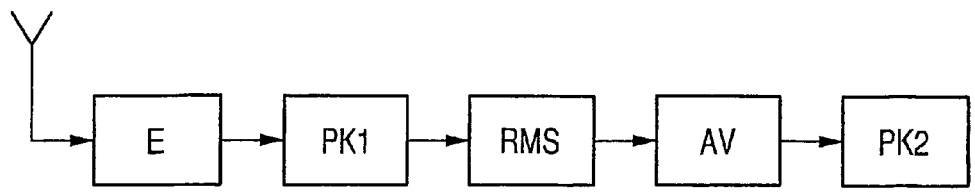
Figure 2:
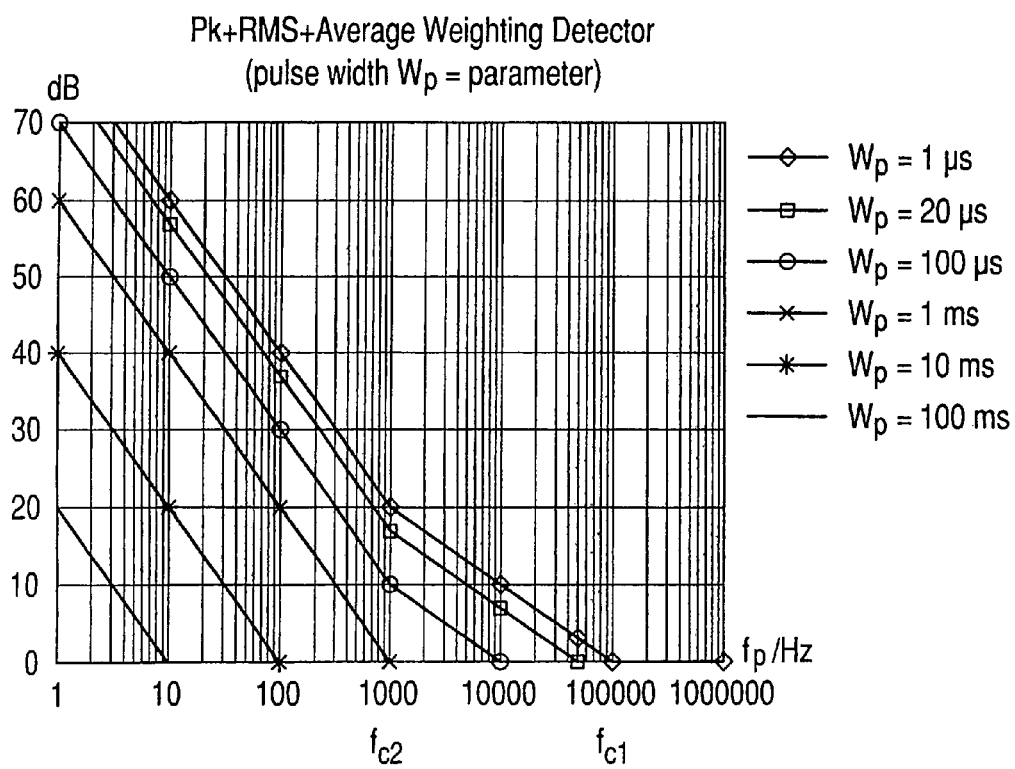

The invention will be described hereinafter in greater detail using an exemplary embodiment and with reference to the schematic drawings, in which:

FIG. 1 is the basic circuit diagram of a detector circuit according to the invention; and FIG. 2 shows the weighting factor as a function of the pulse repetition frequency $f_p$ of a rectifier circuit according to FIG. 1 for various pulse widths $W_p$.

DETAILED DESCRIPTION

FIG. 1 is the basic circuit diagram of a weighting detector according to the invention. The high-repetition frequency impulsive disturbance to be examined is supplied via an antenna, arranged for example in proximity to a motor vehicle to be examined, to a receiver E, where it is converted into an intermediate frequency and detected. The envelope thus obtained of the high-repetition frequency impulsive disturbance is then supplied to the weighting detector itself which, in accordance with the invention, consists of a first peak detector PK1, a subsequent RMS detector RMS and a linear average detector AV.

The peak detector PK1 has a maximum measurement time $T_1 = 1/f_{c1}$, $f_{c1}$ being between 10 kHz and 500 kHz, preferably 100 kHz.

The subsequent rms detector RMS is limited, in relation to the integration time $T_2$ thereof as a function of the cut-off frequency $f_{c2}$, to $T_2 = 1/f_{c2}$. For GSM, for example, the cut-off frequency $f_{c2}$ is 1 kHz; below this frequency, the rms detector weights the impulsive disturbances excessively highly, as is described in detail in DE 101 26 830 A1. For GSM, the cut-off frequency $f_{c2}$ is approximately between 0.5 and 2 kHz. However, it has also already been ascertained that this cut-off frequency can be as low as 5 Hz. The preferably utilized cut-off frequency of 1 kHz entails an integration time of 1 ms.

The rms detector RMS weights the rms value of the impulsive disturbances in successive packets having the duration of the integration time. These rms value packets are then averaged in the linear average detector AV. This linear average detector operates below the cut-off frequency $f_{c2}$, so overall a weighting curve according to FIG. 2 is achieved.

FIG. 2 shows the weighting factor in dB as a function of the pulse repetition frequency $f_p$ for various pulse widths $W_p$. A cascade circuit according to the invention therefore corresponds closely to the theoretically recognized weighting curve and thus avoids erroneous weightings. The peak detector PK1 weights the impulsive disturbances above the cut-off frequency $f_{c1}$ with 0 dB/decade; the subsequent rms detector RMS has a weighting curve rate of rise of approximately 10 dB/decade. The ensuing linear average detector AV has a weighting curve having a rate of rise of approximately 20 dB/decade and these three curves together thus correspond approximately to the desired weighting curve. A further peak detector PK2 can be arranged in a manner known per se at the output of the average detector AV having a time constant in accordance with the CISPR Standard, as is described in detail in DE 101 26 830. The time constant of the linear average detector AV is at least 100 ms in accordance with the CISPR Standard. That which is described in DE 101 26 830 A1 also applies in this regard. It must merely be ensured that the measurement time of the linear average detector is greater than the measurement time $T_2$ of the rms detector.

The invention claimed is:

1. Detector circuit for weighting of impulsive disturbances in relation to their influence on digital radio systems, comprising a cascade circuit of an rms detector, a linear average detector, and a first peak detector arranged upstream of the rms detector.

2. The detector circuit according to claim 1, wherein an integration time $T_2$ of the rms detector is limited to a value $T_2 = 1/f_{c2}$, $f_{c2}$ being the cut-off frequency below which the rms detector weights the impulsive disturbances excessively highly.

3. The detector circuit according to claim 1, wherein a maximum measurement time $T_1$ of the peak detector is $T_1 = 1/f_{c1}$, $f_{c1}$ being the cut-off frequency above which the impulsive disturbance weighting profile is to be constant.

4. The detector circuit according to claim 2, wherein for weighting of disturbances, the cut-off frequency is selected between 5 Hz and 2 kHz.

5. The detector circuit according to claim 1, wherein a second peak detector is arranged at an output of the linear average detector having a time constant in accordance with the CISPR Standard.

6. The detector circuit according to claim 1, wherein the rms, linear average, and first peak detectors connected in cascade are digital circuits.

7. The detector circuit of claim 4, wherein the cut-off frequency is 1 kHz.

8. The detector circuit of claim 5, wherein the rms, linear average, first peak, and second peak detectors are digital circuits.

\* \* \* \* \*